United States Patent
Gao et al.

(10) Patent No.: US 9,178,288 B2
(45) Date of Patent: Nov. 3, 2015

(54) SPRING PLATE FOR ATTACHING BUS BAR TO A PRINTED CIRCUIT BOARD

(71) Applicant: Apple Inc., Cupertino, CA (US)

(72) Inventors: Zheng Gao, San Jose, CA (US); Aaron Miletich, San Jose, CA (US)

(73) Assignee: Apple Inc., Cupertino, CA (US)

(*) Notice: Subject to any disclaimer, the term of this patent is extended or adjusted under 35 U.S.C. 154(b) by 139 days.

(21) Appl. No.: 13/913,358

(22) Filed: Jun. 7, 2013

(65) Prior Publication Data

US 2014/0360749 A1    Dec. 11, 2014

(51) Int. Cl.
H01R 4/48       (2006.01)
H01B 5/02       (2006.01)
H05K 1/18       (2006.01)
H01R 12/70      (2011.01)
H05K 3/32       (2006.01)

(52) U.S. Cl.
CPC .......... *H01R 4/4809* (2013.01); *H01R 12/7088* (2013.01); *H05K 3/325* (2013.01); *H05K 2201/10272* (2013.01)

(58) Field of Classification Search
CPC .......... H01R 4/4809; H01R 4/48; H05K 1/18; H05K 1/181; H05K 1/182; H01B 5/02
USPC ......... 439/212, 213, 251, 248, 353, 357, 387, 439/436–439, 441, 729, 775, 786, 802, 816, 439/817, 819, 828, 834, 839, 861–862; 361/637, 348, 775, 772, 776, 748; 174/68.2, 99 B, 72 B, 71 B, 88 B, 70 B, 174/129 B, 133 B, 149 B
See application file for complete search history.

(56) References Cited

U.S. PATENT DOCUMENTS

| | | | |
|---|---|---|---|
| 4,669,808 A * | 6/1987 | Owen .......................... | 439/858 |
| 4,993,959 A * | 2/1991 | Randolph ....................... | 439/92 |
| 5,618,187 A * | 4/1997 | Goto ................................ | 439/79 |
| 8,388,389 B2 * | 3/2013 | Costello et al. ............... | 439/839 |
| 2007/0254521 A1 * | 11/2007 | D'Agostini et al. .......... | 439/404 |
| 2009/0047814 A1 * | 2/2009 | Daamen ....................... | 439/251 |

* cited by examiner

*Primary Examiner* — Angel R Estrada
*Assistant Examiner* — Dimary Lopez Cruz
(74) *Attorney, Agent, or Firm* — Kilpatrick Townsend & Stockton LLP

(57) ABSTRACT

Bus bar or power connector connections that are reliable and provide a reduced connection impedance. One example may provide a reliable connection by providing a spring plate. The spring plate may be arranged to hold a bus bar or other power conductor to a printed circuit board. The spring plate may further include an opening for a fastener, where the fastener is used to secure the bus bar to the printed circuit board. In this way, the spring plate may secure the bus bar to the printed circuit board in the event that the fastener is loosened or missing, thereby increasing the reliability of the bus bar connection. Further, the spring plate may provide an additional current path, thereby reducing the impedance of the bus bar connection.

24 Claims, 15 Drawing Sheets

SPRING PLATE FOR ATTACHING BUS BAR TO A PRINTED CIRCUIT BOARD

BACKGROUND

Electronic devices, such as portable computing devices, tablets, desktops, and all-in-one computers, cell phones, smart phones, and media phones, storage devices, portable media players, navigation systems, monitors and other devices, have become ubiquitous in recent years. These devices typically include circuitry such as processors, input and output circuits, memories, and others. These circuits are typically powered by voltage supplies. These voltage supplies may be a positive supply and ground, a positive supply and a negative supply, a ground and a negative supply, or some combination thereof.

The circuits in these electronic devices may be located on one or more printed circuit boards. These printed circuit boards may include main-logic boards, motherboards, daughter boards, or other types of boards. To power these circuits, the power supplies may be connected to the boards on which the circuits are located.

These power supplies may be routed via wires or cables from a printed circuit board to a connector, battery, or other appropriate connection. In situations where large currents are conveyed, a wide power conductor, which may be referred to as a bus bar (sometime written as bus bar) may be used.

Conventional bus bar connections may be unreliable. That is, conventional connections between bus bars and printed circuit boards may become loose with time due to movement of the device. For example, dropping a device or taking it for a ride in a car may cause a connection between a bus bar and a printed circuit board to work itself loose.

This loosening of a connection between a bus bar and a printed circuit board may cause functionality problems. Also, this loosening may cause an increase in impedance, which may waste power, cause heating, and again reduce functionality. Further, conventional bus bar connections may have excess impedance, which again may waste power, cause heating, and reduce functionality.

Thus, what is needed are bus bar or power connector connections that are reliable and provide a reduced connection impedance.

SUMMARY

Accordingly, what is needed are bus bar or power connector connections that are reliable and provide a reduced connection impedance. An illustrative embodiment of the present invention may provide a reliable connection by providing a spring plate. The spring plate may be arranged to hold a bus bar or other power conductor to a printed circuit board. The spring plate may further include an opening for a fastener, where the fastener is used to secure the bus bar to the printed circuit board. The spring plate and fastener may each physically secure the bus bar to the printed circuit board, and they both may form an electrical path between the bus bar and an electrical connection such as one or more traces or planes on or in the printed circuit board. The spring plate may also secure the bus bar to the printed circuit board in the event that the fastener is loosened or missing. This may make the fastener redundant, thereby increasing the reliability of the bus bar connection. That is, the spring plate may provide a self-contained connection between a bus bar and a printed circuit board in the event that the fastener is absent or removed. Further, the spring plate may provide an additional current path, thereby reducing the impedance of the bus bar connection as compared to a lone fastener.

An illustrative embodiment of the present invention may provide a printed circuit board having an opening and a bus bar having a corresponding opening. A spring plate may be mounted on the printed circuit board. For example, the spring plate may include one or more tabs that fit in openings in the printed circuit board. The tabs may then be soldered to the printed circuit board to secure the spring plate in place. For example, if the bus bar is for a ground connection, the tabs may be soldered to ground connections on the printed circuit board. The bus bar may be inserted into a first opening in the spring plate. A second opening of the spring plate may be aligned to the openings in the printed circuit board and the bus bar. A fastener may be inserted through the openings in the printed circuit board, spring plate, and bus bar to secure the bus bar to the printed circuit board.

Various fasteners may be used in embodiments of the present invention. In a specific embodiment of the present invention, a threaded boss may be soldered to an underside of a printed circuit board. A threaded screw may be inserted through a bus bar, spring plate, and printed circuit board and into the boss, and then tightened in order to secure the bus bar to the printed circuit board. In other embodiments of the present invention, other types of fasteners, such as pins, bolts, clamps, or other types of fasteners may be used. In other embodiments of the present invention, a boss or nut may be located on a top side of a printed circuit board, in which case there may be no opening in the printed circuit board. In still other embodiments, a boss or nut may be formed as part of a printed circuit board.

An illustrative embodiment of the present invention may provide a spring plate having an intermediate portion including a first opening, a top plate attached to a top of, and orthogonal to, the intermediate portion and including a plurality of fingers, and a bottom plate attached to a bottom of, and orthogonal to, the intermediate portion and including a plurality of fingers and a second opening. The fingers on the bottom plate may be biased in a first direction and the fingers on the top plate are biased in a second direction, the second direction opposite the first direction.

Another illustrative embodiment of the present invention may provide a spring plate having a bottom plate including a first opening and a plurality of fingers, a left plate attached at a left edge and orthogonal to the bottom plate and including a plurality of fingers, the plurality of fingers forming a top of a second opening; and a right plate attached at a right edge and orthogonal to the bottom plate and including a plurality of fingers, the plurality of fingers forming a top of a third opening.

Another illustrative embodiment of the present invention may provide a spring plate having a front plate having a first opening and a plurality of fingers, a back plate at least approximately parallel to the front plate and having a second opening and a plurality of fingers, and a joining piece joining the front plate to the back plate at a first end of the front plate and a first end of the back plate, such that a third opening is formed between a second end of the front plate and a second end of the back plate, the second end of the front plate opposite the first end of the front plate and the second end of the back plate opposite the first end of the back plate.

Various embodiments of the present invention may provide spring plates formed using various methods. For example, spring plates consistent with embodiments of the present invention may be formed by stamping, lathing, metal injection molding, 3-D printing, by using computer numerical control (CNC) machines, or by other techniques.

These spring plates may be formed of various materials. For example, spring plates consistent with embodiments of the present invention may be formed of stainless steel, copper, copper titanium, phosphor bronze, nickel, or other appropriate material, and they may be plated with copper, nickel, palladium, gold, or other appropriate material.

While embodiments of the present invention are particularly well-suited to use with bus bars or power conductors for positive power supplies, negative power supplies, or ground, embodiments of the present invention may convey other types of supplies, voltages, control signals, or other electronic voltages or signals.

While embodiments of the present invention are particularly well-suited for use in connecting bus bars or power conductors to a printed circuit board, embodiments of the present invention may be used to connect bus bars or power conductors to flexible circuit boards or other appropriate substrates.

Embodiments of the present invention may be used with various types of electronic devices, such as portable computing devices, tablets, desktops, and all-in-one computers, cell phones, smart phones, and media phones, storage devices, portable media players, navigation systems, monitors and other devices.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
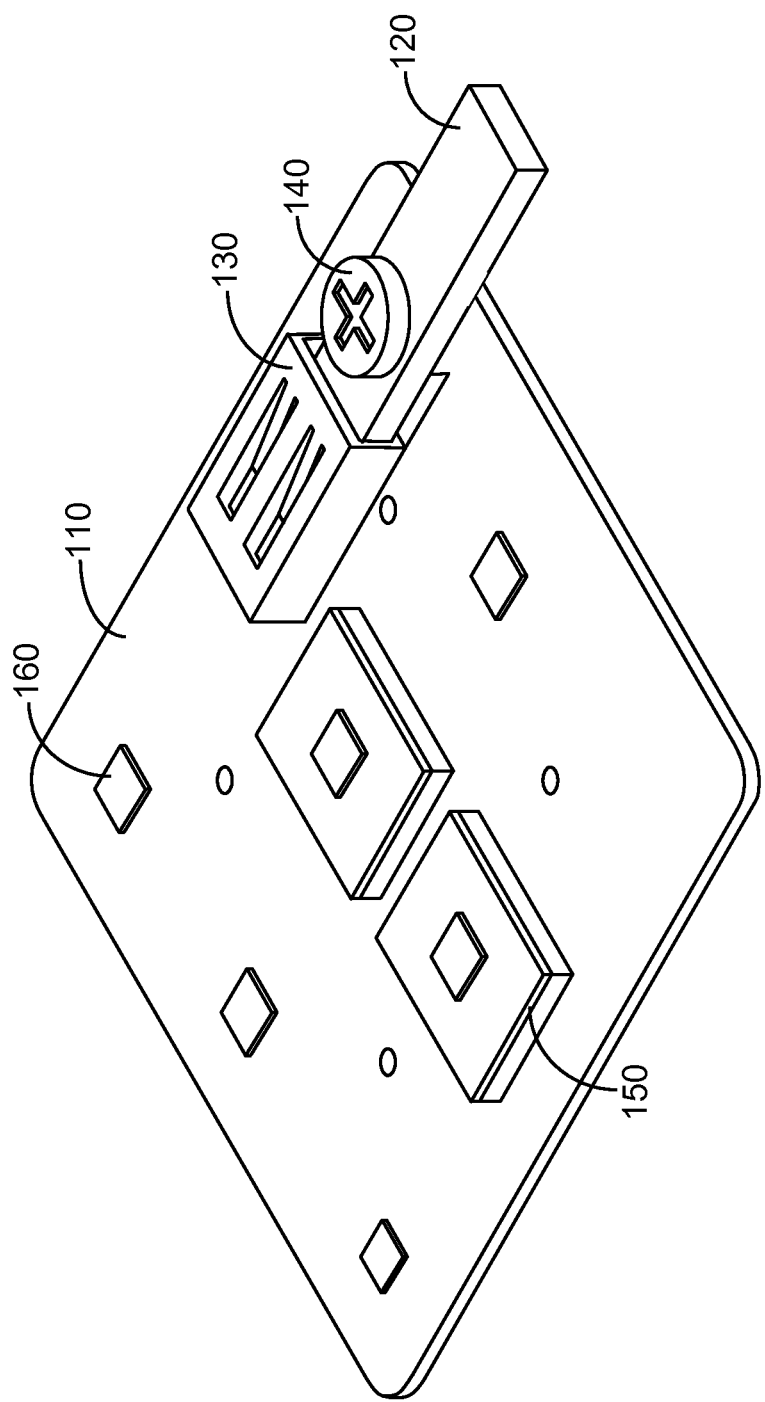
FIG. 1 illustrates a portion of an electronic device according to an embodiment of the present invention.

FIG. 1 illustrates a portion of an electronic device according to an embodiment of the present invention. This figure, as with the other included figures, is shown for illustrative purposes and does not limit either the possible embodiments of the present invention or the claims.

This figure illustrates a portion of a printed circuit board 110 supporting a number of integrated circuits 150 and other components 160. Bus bar or power conductor 120 may be connected to a ground, power supply voltage, bias voltage, or other high current line. This connection may be to a connector, cable, battery, or other component. Power connector 120 may be connected to an electrical connection such as traces or a power or ground plane on printed circuit board 110 via spring plate 130 and fastener 140. By using both spring plate 130 and fastener 140, the reliability of the connection between power connector 120 and printed circuit board 110 may be improved. Also, the inclusion of both components may reduce the impedance of the connection between bus bars or power conductors 120 and traces or planes on printed circuit board 110. In various embodiments of the present invention, spring plate 130 may be capable of securing bus bar 120 to printed circuit board 110 both mechanically and electrically in the event that fastener 140 is missing or absent. This may render fastener 140 redundant, thereby increasing the reliability of the connection between bus bar 120 and printed circuit board 110. That is, spring plate 130 may provide a self-contained electrical and mechanical connection between bus bar 120 and printed circuit board 110. It should be noted that while in this example one spring plate 130 is used to secure one bus bar 120 to printed circuit board 110, in other examples, more than one spring plate 130 may be used to secure more than one bus bar 120 to printed circuit board 110.

Examples of various spring plates that may be used to make electrical connections between power conductors 120 and traces or planes on printed circuit boards 110, as well as to mechanically secure power conductors 120 to printed circuit board 110, are shown in the following figures.

Figure 2:
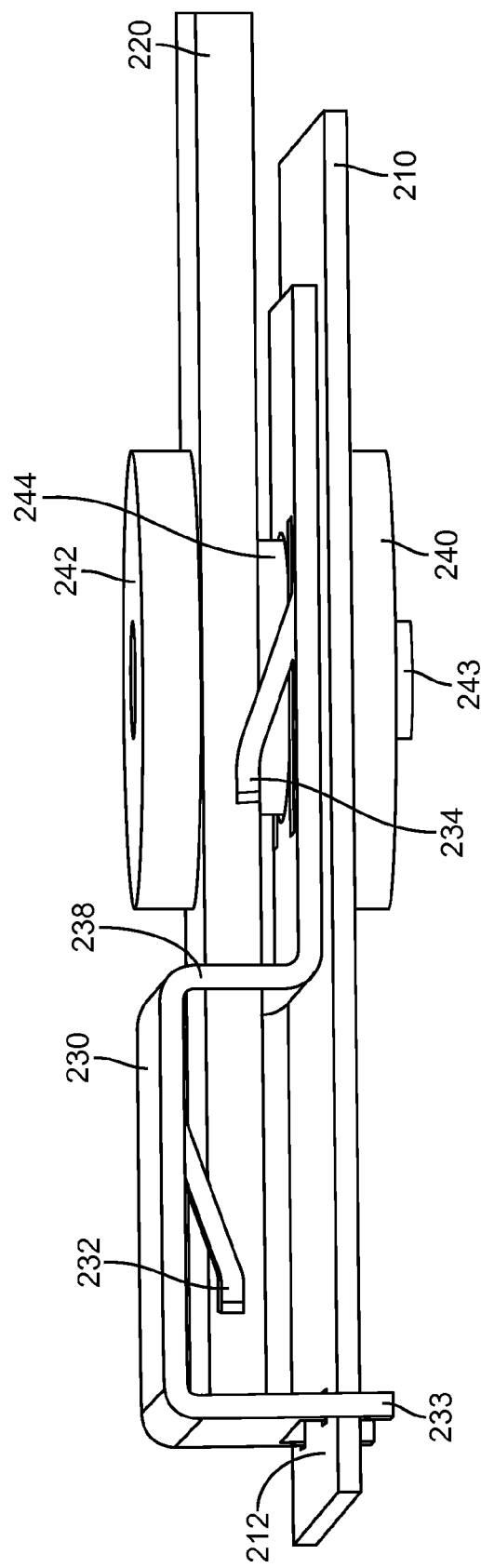
FIG. 2 illustrates a side view of a connection between a bus bar and a printed circuit board according to an embodiment of the present invention.

FIG. 2 illustrates a side view of a connection between a bus bar and a printed circuit board according to an embodiment of the present invention. FIG. 2 illustrates a bus bar or power connector 220 connected to printed circuit board 210 using spring plate 230 and a fastener that includes boss 240 and screw 242.

Specifically, spring plate 230 may be attached to a printed circuit board 210 by inserting tabs 233 into opening 212 of printed circuit board 210. Tabs 233 may be soldered to metallized areas around openings 212. These metalized areas may be connected to traces or planes in or on printed circuit board 210. Bus bar or power connector 220 may be inserted through opening 238 into spring plate 230. This may cause the deflection of fingers 232 and 234. (Note that these fingers are shown in an un-deflected state for clarity.) A threaded boss 240 may be attached to an underside of printed circuit board 210. Screw 242 may include an insertion portion 243, which may be inserted through openings in bus bar 220, spring plate 230, and printed circuit board 210. Insertion portion 243 of screw 242 may be threaded and screwed into boss 240 to secure bus bar 220 to printed circuit board 210.

Spacer 244 may be included to offset bus bar 220 vertically from printed circuit board 210. Spacer 244 may be a washer or it may be a portion of threaded boss 240. Threaded boss 240 and spacer 244 may either or both be connected to traces or planes in or on printed circuit board 210.

Figure 3:
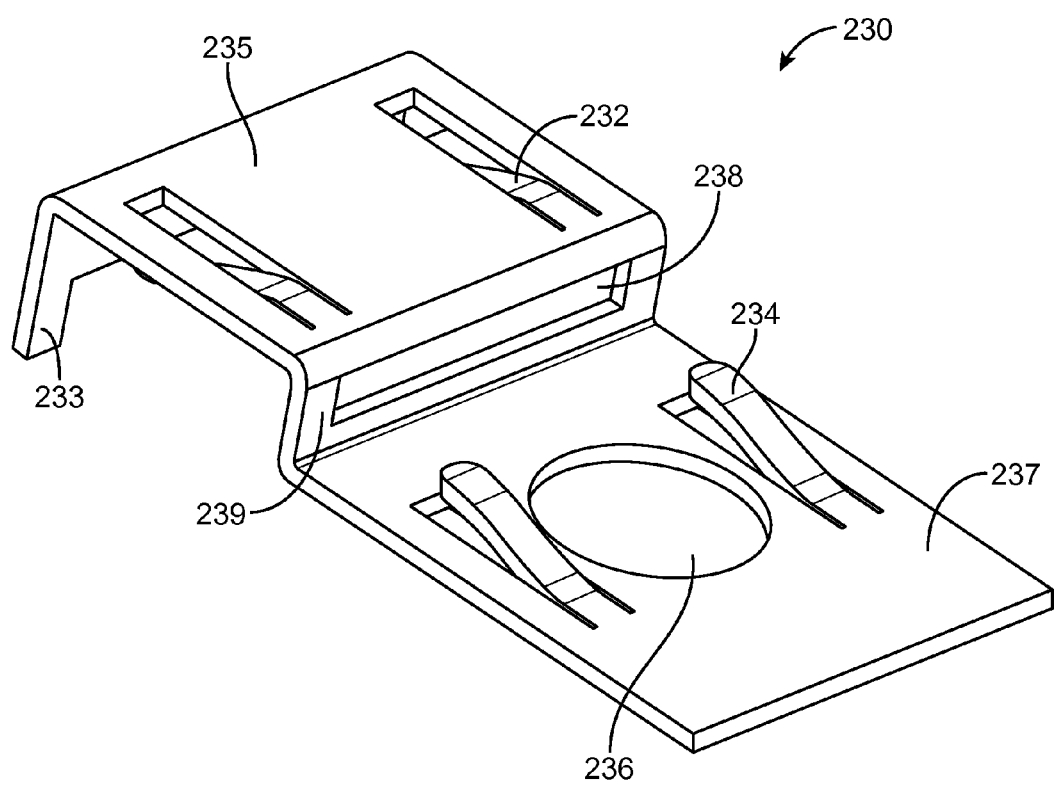
FIG. 3 illustrates the spring plate of FIG. 2.

FIG. 3 illustrates the spring plate of FIG. 2. Spring plate 230 may include an intermediate plate 239 having an opening 238. Opening 238 may be used to receive a bus bar or power connector. Spring plate 230 may further include top plate 235 and bottom plate 237. Top plate 235 may be attached to a top of intermediate plate 239 while bottom plate 237 may be attached to a bottom edge of intermediate plate 239. Top plate 235 and bottom plate 237 may be orthogonal to intermediate plate 249. Top plate 235 may include one or more fingers 232, while bottom plate 237 may include one or more fingers 234. Fingers 232 may be pre-biased in a downward direction, while fingers 234 may be pretty biased upward. This opposing biasing may provide a tension on bus bar 220, thereby securing bus bar 220 in place. Bottom plate 237 may include opening 236, which may accept a fastener used to secure a bus bar to a printed circuit board. Tabs 233 may be inserted into corresponding openings and a printed circuit board and soldered to traces or planes on our in a printed circuit board.

Figure 4:
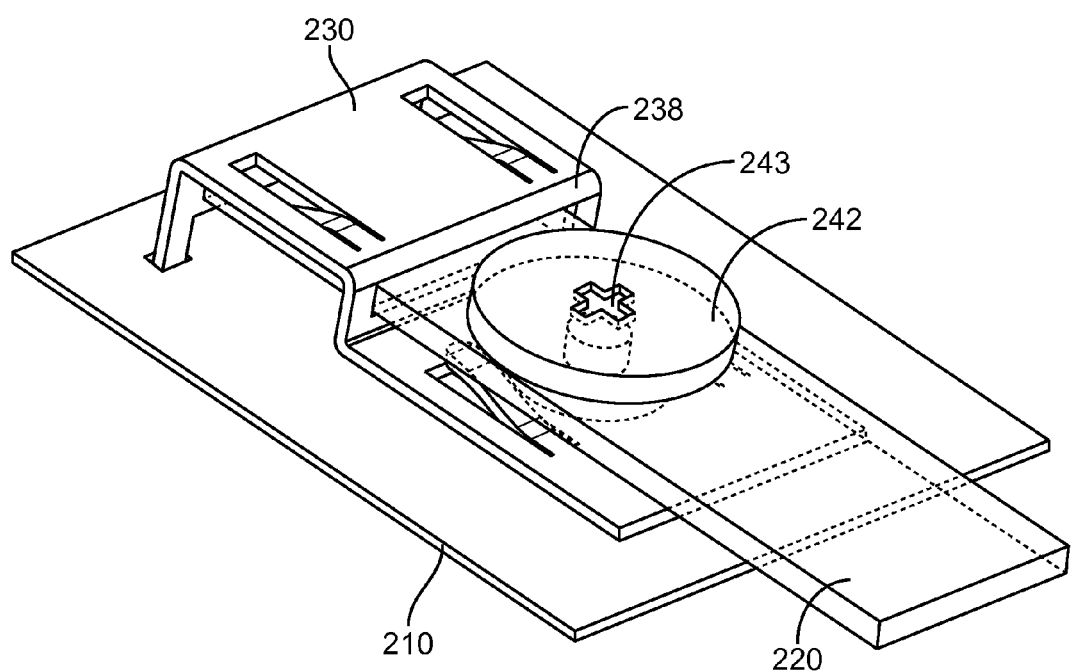
FIG. 4 illustrates a top oblique view of a portion of an electronic device according to an embodiment of the present invention.

FIG. 4 illustrates a top oblique view of a portion of an electronic device according to an embodiment of the present invention. Again, spring plate 230 and screw 242 may be used to mechanically secure and electrically connect bus bar or power connector 220 to printed circuit board 210. Specifically, bus bar or power conductor 220 may be inserted in opening 238 of spring plate 230 until it reaches a back edge of spring plate 230. Screw 242 may be inserted through openings in bus bar 220, spring plate 230, and printed circuit board 210. Screw 242 may be tightened by placing appropriate tool into region 243 and turning.

In this and other embodiments of the present invention, even if a fastener, such as screw 242, becomes loose, or is removed or absent, the spring plate, such as spring plate 230, may continue to mechanically secure and electrically connect a bus bar to a printed circuit board. That is, spring plate 230, as with the other spring plates in these examples and other embodiments of the present invention, may provide a self-contained mechanical and electrical connection between bus bar 220 and printed circuit board 210. In this way, fasteners, such as fastener or screw 242 may be a redundant connection between bus bar 220 and printed circuit board 210. Spring plate 230 and screw 242 may each provide an electrical path from bus bar 220 to traces or planes in or on printed circuit board 210, thereby reducing connection impedance when a fastener is present.

In this and the other included examples, spring plates are secured to bus bars and printed circuit boards using fasteners such as a screw and threaded boss (or nut.) In other embodiments of the present invention, other types of fasteners, such as pins, clips, bolts, or other fasteners, may be used. In other embodiments of the present invention, a boss or nut may be located on a top side of a printed circuit board, in which case there may be no opening in the printed circuit board. In still other embodiments, a boss or nut may be formed as part of a printed circuit board.

In various applications, board space may be at a premium. Accordingly, embodiments of the present invention may provide a spring plate that consumes a reduced amount of board space. An example is shown in the following figures.

Figure 5:
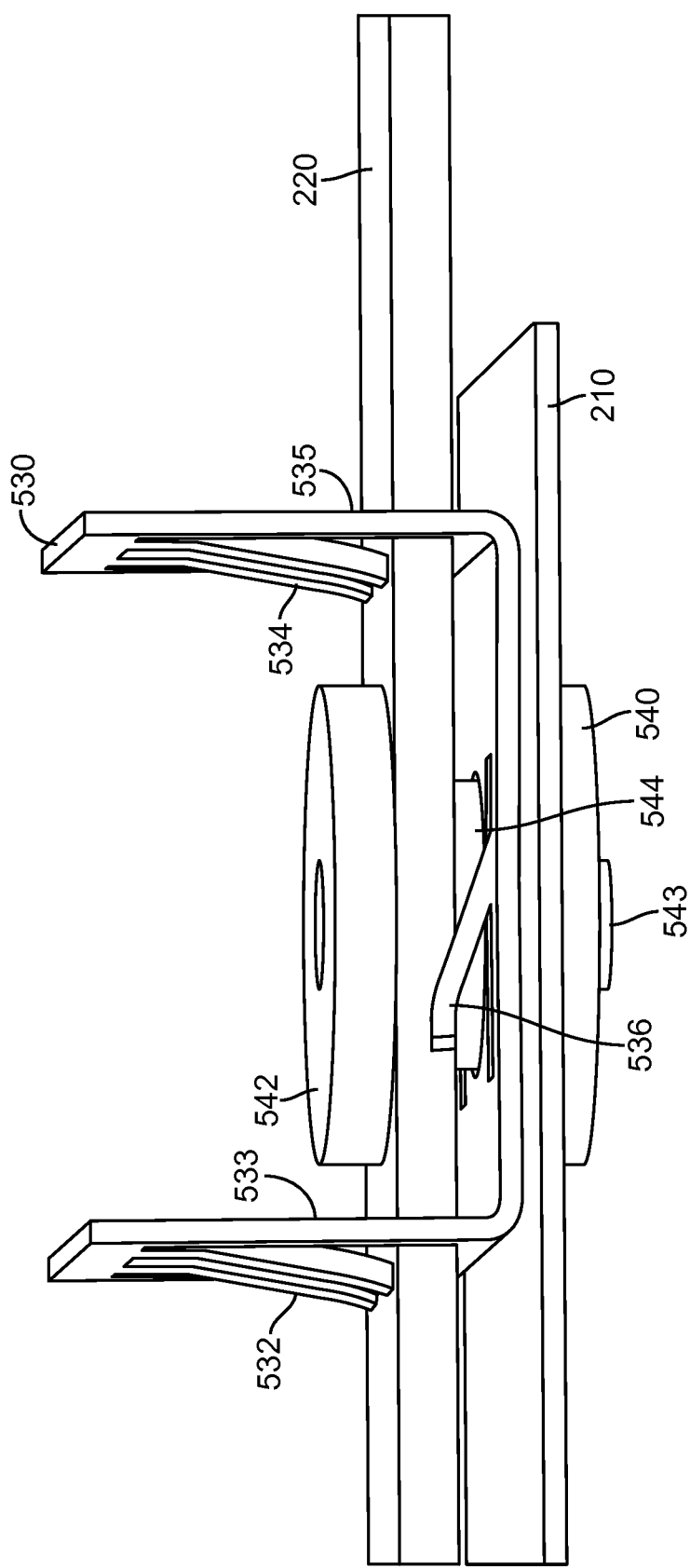
FIG. 5 illustrates a portion of an electronic system according to an embodiment of the present invention.

FIG. 5 illustrates a portion of an electronic system according to an embodiment of the present invention. In this example, spring plate 530 and a fastener including screw 542 and threaded boss 540 may be used to mechanically and electrically secure bus bar 220 to printed circuit board 210.

Specifically, bus bar 220 may be inserted through openings 533 and 535 in spring plate 530. Boss 540 may be soldered to an underside of printed circuit board 210. Insertion portion 543 of screw 542 may be inserted through openings in bus bar 220, spring plate 530, and printed circuit board 210 and into boss 540. Fingers 536, 532, and 534 may provide tension on bus bar 220, thereby securing bus bar 220 in place. As before, spacer 544 may be placed between bus bar 220 and printed circuit board 210. Spacer 544 may be a washer or a portion of boss 540.

Figure 6:
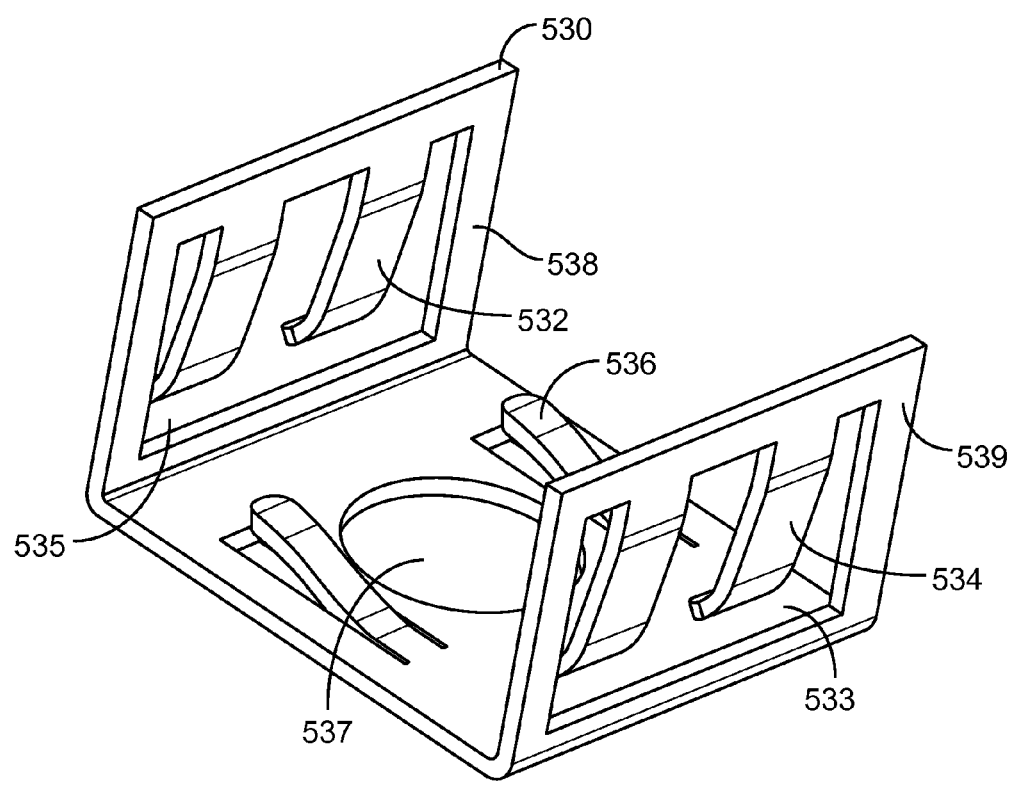
FIG. 6 illustrates the spring plate of FIG. 5.

FIG. 6 illustrates the spring plate of FIG. 5. Spring plate 530 may include bottom plate 531, left plate 538, and right plate 539. Bottom plate 531 may include opening 537 for accepting a fastener. Bottom plate 531 may also include fingers 536. Right plate 539 may include fingers 539 forming opening 533, while left plate 538 may include fingers 532 forming opening 535. Right plate 539 and left plate 538 may be attached to, and orthogonal to, bottom plate 531.

Figure 7:
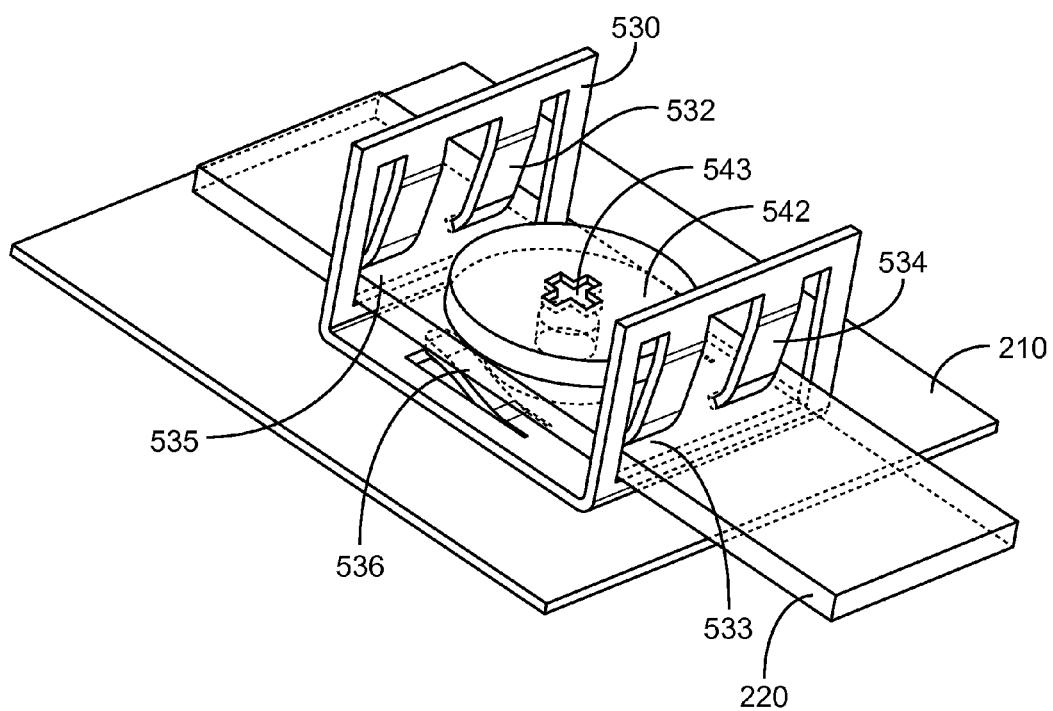
FIG. 7 illustrates an oblique view of a portion of an electronic device according to an embodiment of the present invention.

FIG. 7 illustrates an oblique view of a portion of an electronic device according to an embodiment of the present invention. Again, bus bar 220 may be inserted through openings 533 and 535 in spring plate 530. Screw 542 may be inserted through openings in bus bar 220, spring plate 530, and printed circuit board 210. Fingers 532, 534, and 536 may provide tension on bus bar 220, thereby securing bus bar 220 in place in the event that screw 542 comes loose. Screw 542 may be tightened by turning a tool placed in region 543.

In the previous examples, a horizontal connection may be made between bus bar 220 and printed circuit board 210. In other embodiments of the present invention, a vertical connection may be made between a bus bar and a printed circuit board. Such a vertical connection may be used to reduce the amount of board space consumed. An example is shown in the following figure.

Figure 8:
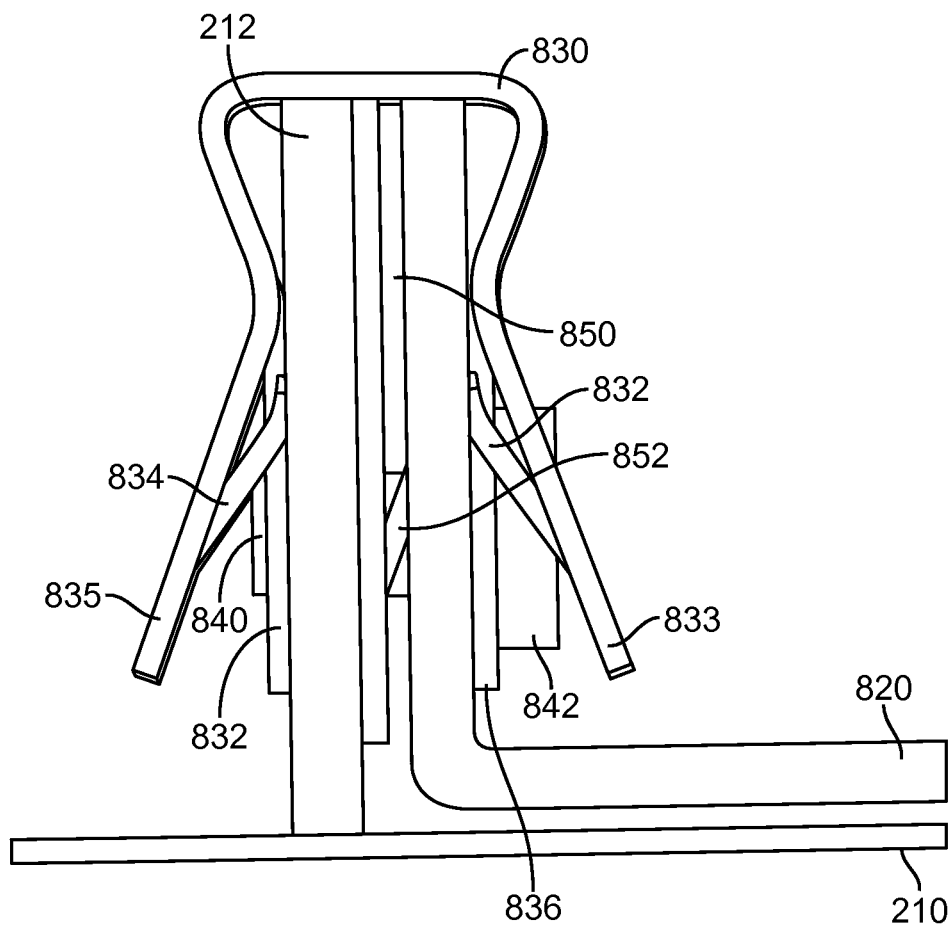
FIG. 8 illustrates a connection between a bus bar and a printed circuit board according to an embodiment of the present invention.

FIG. 8 illustrates a connection between a bus bar and a printed circuit board according to an embodiment of the present invention. In this example, bus bar 820 may be formed to have a right angle. A vertical board 212 may be connected to printed circuit board 210. Vertical board 212 may include traces and planes to be electrically connected to bus bar 220 using spring plate 830 and fastener 842.

In this example, vertical board 212 may be secured or fastened to printed circuit board 210. Bias plate 850 and bus bar 820 may be aligned to vertical board 212. Spring plate 830 may be slid down over vertical board 212, bias plate 850, and the vertical portion of bus bar 820. Screw 842 may be inserted into threaded boss 840 to secure spring plate 830, bias plate 850, bus bar 820, and vertical board 212 together. Since spring plate 830 essentially clamps bus bar 820 to vertical board 212, bus bar 820 may remain secured to vertical board 212, and therefore printed circuit board 210, even if fastener 842 inadvertently becomes loose, or is absent or otherwise missing.

Figure 9:
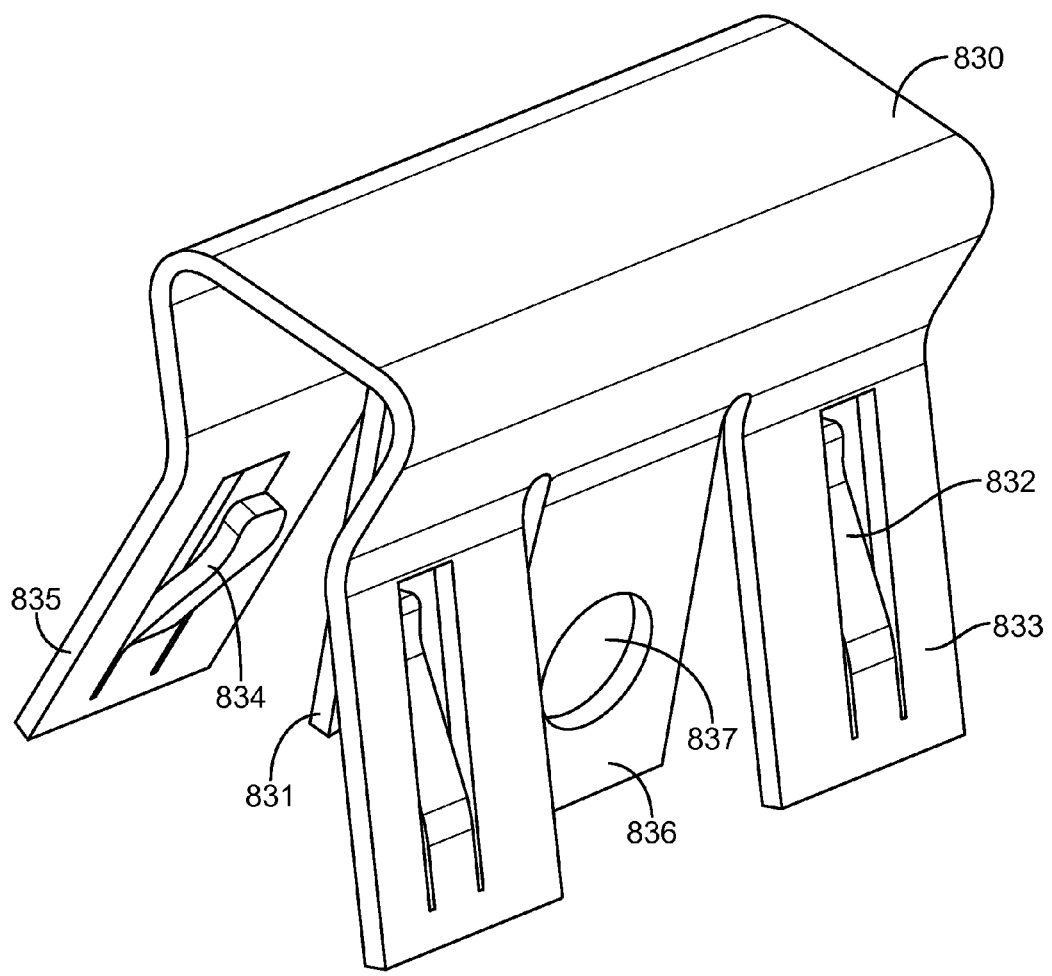
FIG. 9 illustrates the spring plate shown in FIG. 8.

FIG. 9 illustrates the spring plate shown in FIG. 8. Spring plate 830 may include front plate 836, backplate 831, and joining piece 838. Side portions 833 and 835 may include fingers 832 and 834 and may be separated from front and back plates 836 and 831. Front and back plates 836 and 831 may include openings, such as opening 837, to accept a fastener.

Figure 10:
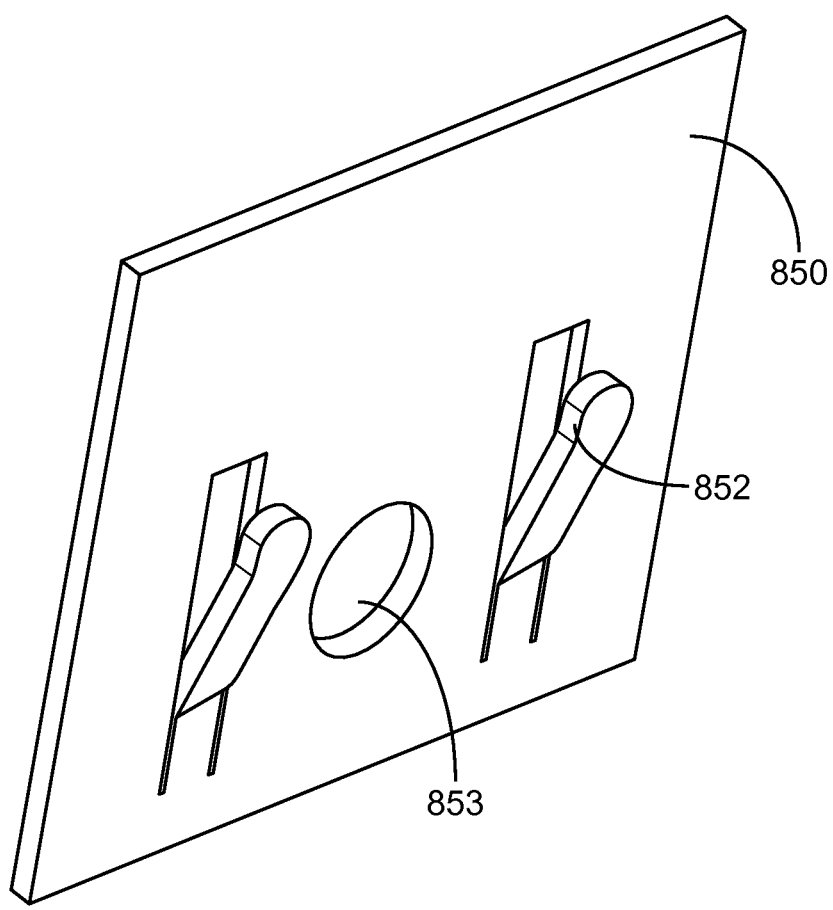
FIG. 10 illustrates the bias plate shown in FIG. 8.

FIG. 10 illustrates the bias plate shown in FIG. 8. Bias plate 850 may include opening 853 for accepting a fastener and fingers 852.

Figure 11:
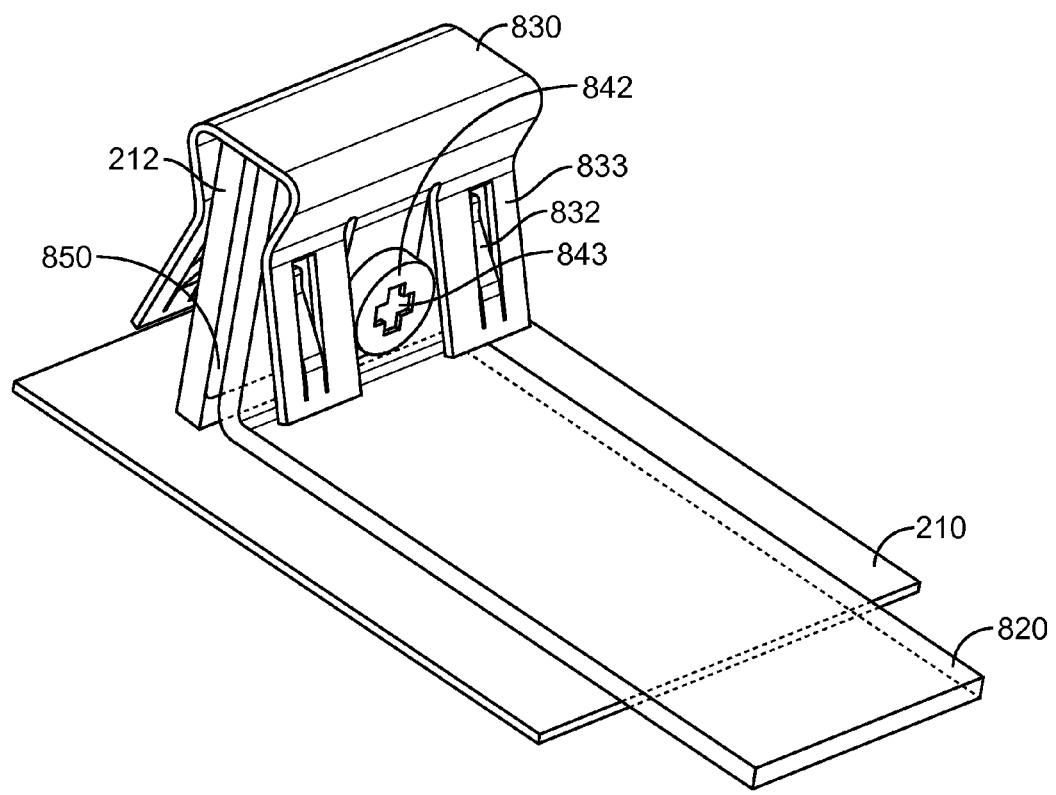
FIG. 11 illustrates an oblique view of a portion of electronic device according to an embodiment of the present invention.

FIG. 11 illustrates an oblique view of a portion of electronic device according to an embodiment of the present invention. In this example, bus bar or power connector 820 may be mechanically attached to printed circuit board 210, and electrically connected to traces in printed circuit board 210, through spring plate 830 and fastener 842. Spring plate 830 may include side portions 833 having fingers 832. Fastener 842 may be inserted through openings in spring plate 830, bus bar 820, and vertical plate 212. Screw 842 may be tightened by placing a tool in region 843 and turning.

Again, the spring plate in the above example forms a clamp to secure a bus bar to a vertical board portion. Another such spring plate is shown in the following figure.

Figure 12:
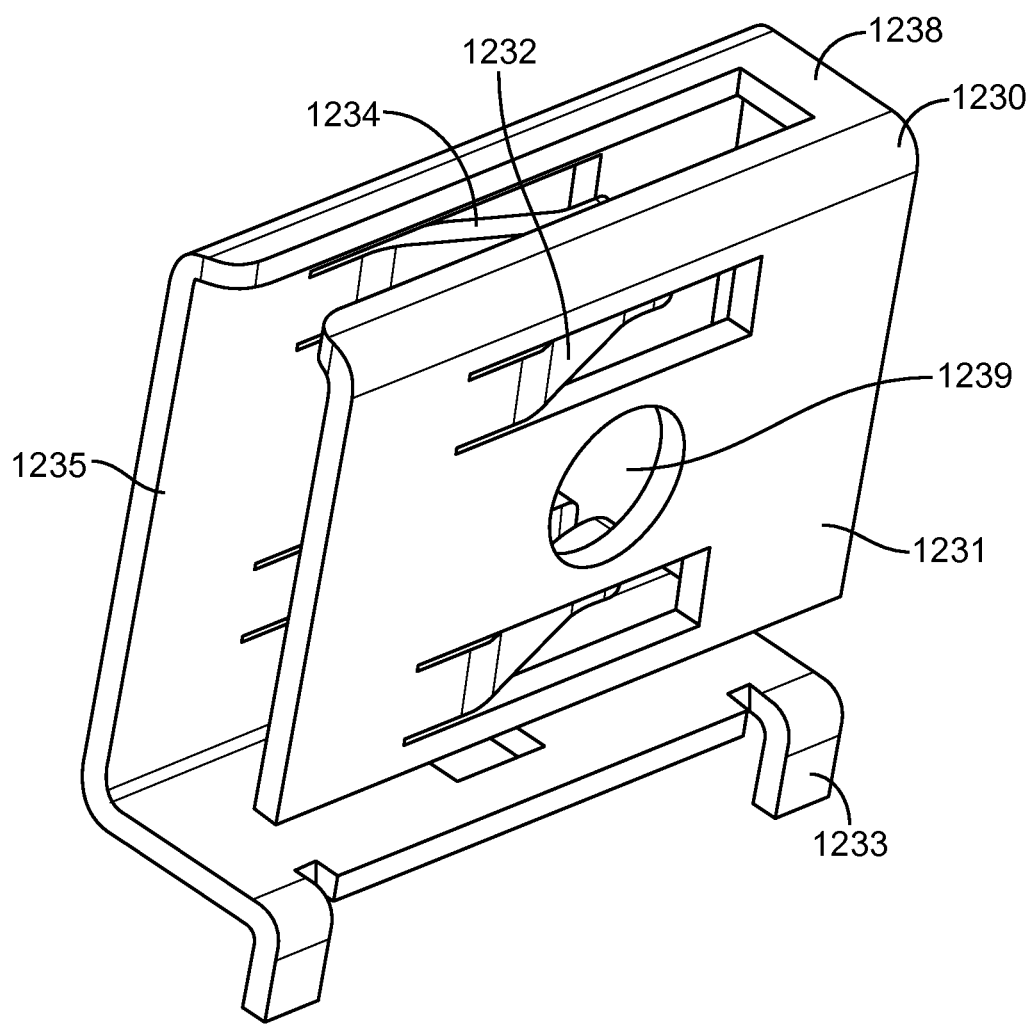
FIG. 12 illustrates a spring plate according to an embodiment of the present invention.

FIG. 12 illustrates a spring plate according to an embodiment of the present invention. Spring plate 1230 may include front plate 1231, backplate 1235, and joining portion 1238. Front plate 1231 may include opening 1239 to accept a fastener, and fingers 1232. Backplate 1235 may include fingers 1234, an opening (not shown) to also accept the fastener. Spring plate 1230 may further include tabs 1233. Tabs 1233 may be used to secure spring plate 1230 to a printed circuit board. Specifically, tabs 1233 may be placed in and soldered to openings in a printed circuit board.

Figure 13:
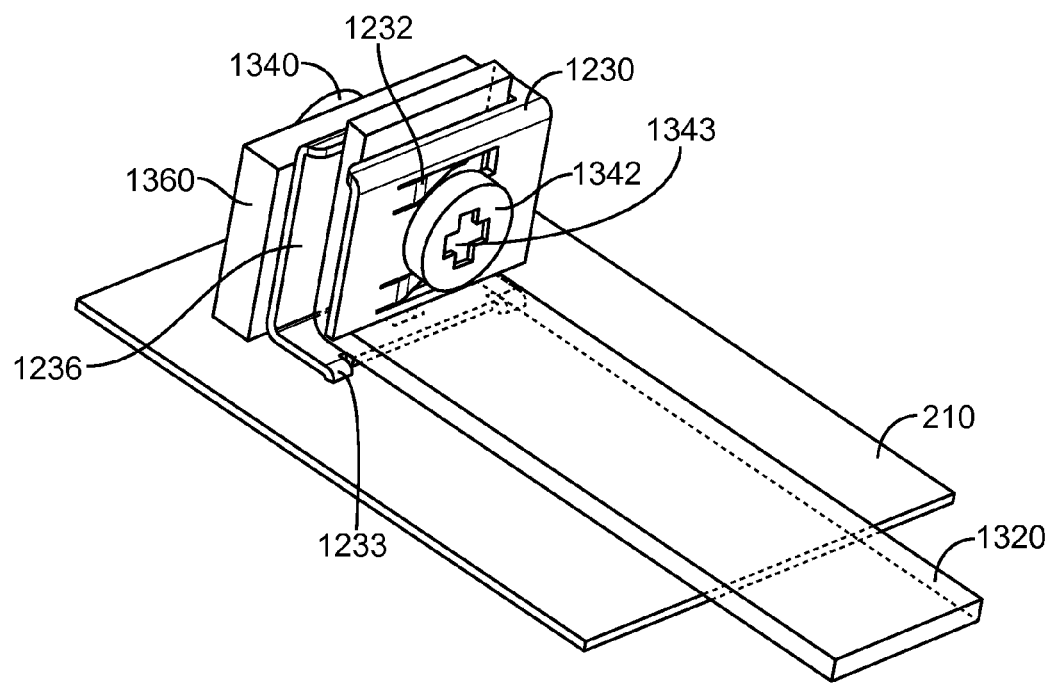
FIG. 13 illustrates an oblique view of a portion of electronic device according to an embodiment of the present invention.

FIG. 13 illustrates an oblique view of a portion of electronic device according to an embodiment of the present invention. In this example, bus bar 1320 may be secured to vertical board 1360 using spring plate 1230 and fastener 1342.

Specifically, a vertical portion of bus bar 1230 may be inserted into opening 1236 in spring plate 1230. Fastener 1342 may be inserted through openings in spring plate 1230, bus bar 1320, and vertical board 1360. Fastener 1342 may be threaded into boss 1340, which may be fixed to a back side of vertical board 1360. Screw 1342 may be tightened by inserting a tool in region 1543 and turning.

Figure 14:
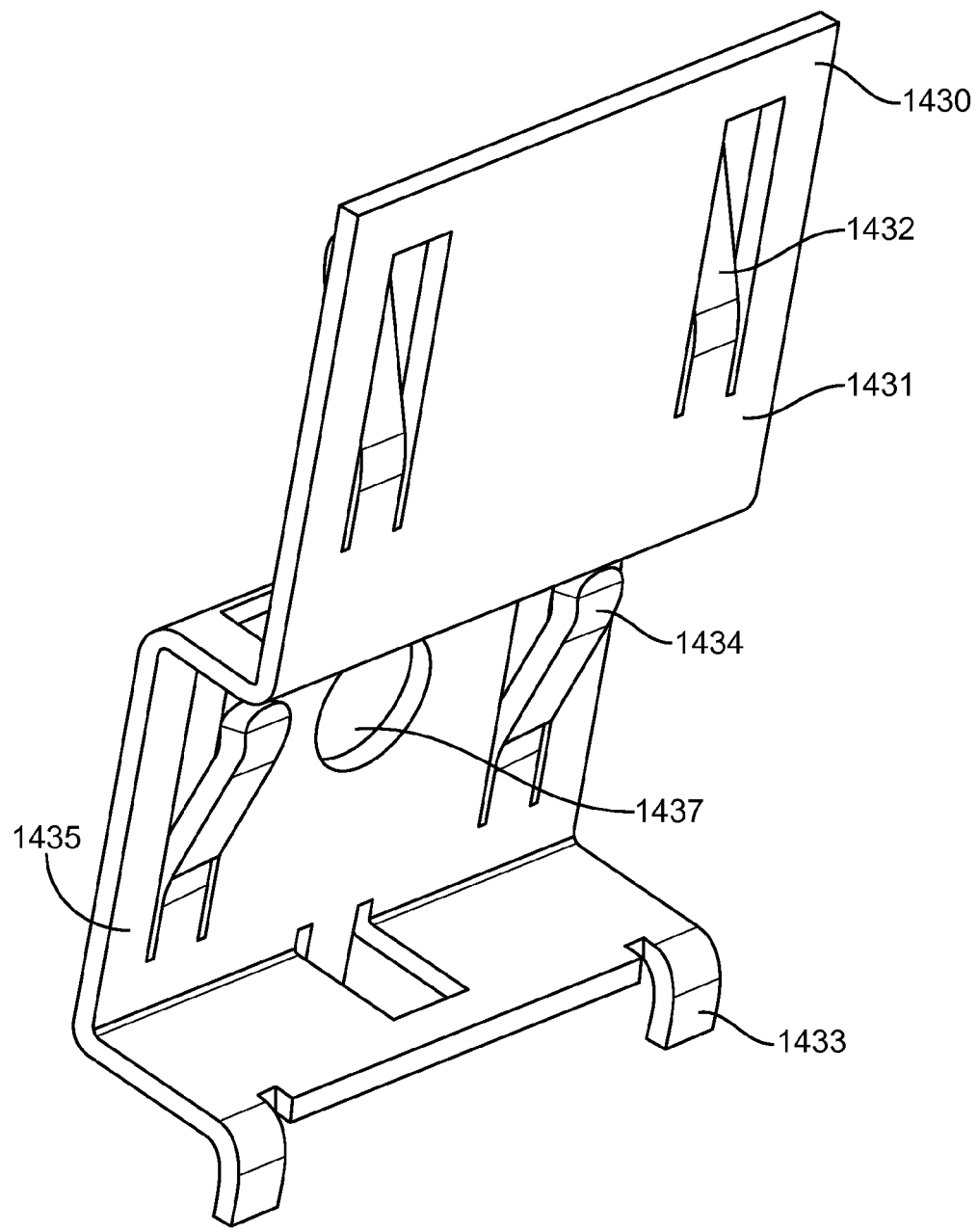
FIG. 14 illustrates another spring plate according to an embodiment of the present invention.

FIG. 14 illustrates another spring plate according to an embodiment of the present invention. Spring plate 1430 may include top plate 1431 having fingers 5042 and bottom plate 1435 having fingers 1434 and opening 1437. Spring plate 1430 may further include tabs 1433. As with similar tabs in the above examples, tabs 1433 may be inserted and soldered to openings in a printed circuit board to secure spring plate 1430 in place.

Figure 15:
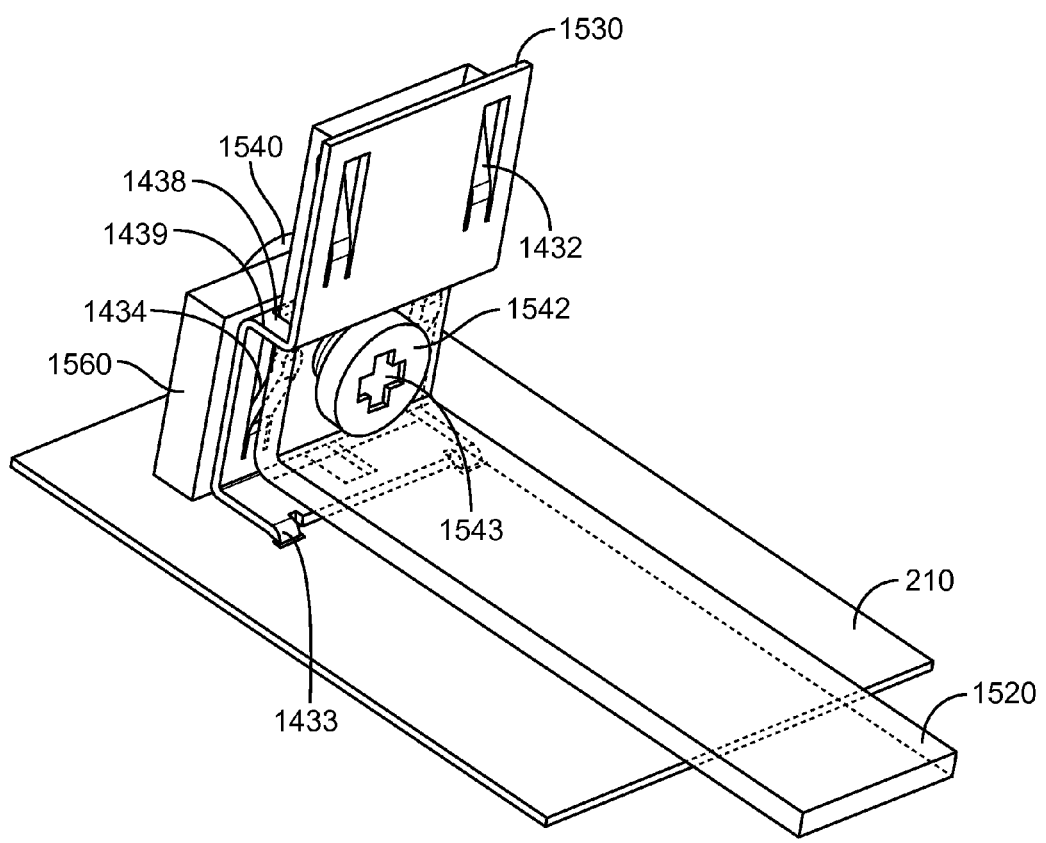
FIG. 15 illustrates an oblique view of a portion of an electronic device according to an embodiment of the present invention.

FIG. 15 illustrates an oblique view of a portion of an electronic device according to an embodiment of the present invention. In this example, bus bar 1520 may be secured to printed circuit board 210 both mechanically and electrically using spring plate 1530 and fastener 1542. A vertical portion of bus bar 1520 may be inserted through opening 1438 in an intermediate plate 1439 of spring plate 1530. Fastener 1542 may be inserted through openings in bus bar 1520, spring plate 1530, and vertical board 1560. Threaded boss 5040 may be attached to a back side of vertical board 1560 to accept fastener or screw 1542. Fastener or screw 1542 may be tight and by inserting a tool in region 1543 and turning.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A spring plate comprising:
a top plate including a plurality of fingers;
a bottom plate including a plurality of fingers;
a first opening between the top plate and the bottom plate; and
a second opening in the bottom plate to accept a fastener, wherein the spring plate is arranged to accept a power conductor inserted in the first opening, and
wherein the fingers on the bottom plate are biased in a first direction and the fingers on the top plate are biased in a second direction, the second direction opposite the first direction.

2. The spring plate of claim 1 wherein the spring plate is fastened to a board in an electronic device by the fastener, wherein the board comprises a printed circuit board.

3. The spring plate of claim 1 wherein the spring plate is fastened to a board in an electronic device by the fastener, wherein the board is attached to a printed circuit board.

4. The spring plate of claim 1 wherein the spring plate is fastened to a board in an electronic device by the fastener, wherein the fastener includes a receiving portion that is threaded to accept a threaded inserting portion.

5. The spring plate of claim 4 wherein the spring plate is formed to have an intermediate portion that includes the first opening, the spring plate further comprising the top plate and the bottom plate, each at right angles to the intermediate portion.

6. The spring plate of claim 1 wherein the spring plate further includes tabs to fit in corresponding openings of a board.

7. The spring plate of claim 6 wherein the spring plate secures a power conductor to the board when the inserting portion of the fastener is removed.

8. The spring plate of claim 7 wherein the spring plate electrically connects the power conductor to an electrical connection on the board when the inserting portion of the fastener is removed.

9. The spring plate of claim 1 wherein the spring plate is fastened to a board in an electronic device by the fastener, wherein the fastener further has a head portion wider than the power conductor and resides on a top side of the power conductor.

10. A spring plate comprising:
an intermediate portion including a first opening;
a top plate attached to a top of, and orthogonal to, the intermediate portion and including a plurality of fingers; and
a bottom plate attached to a bottom of, and orthogonal to, the intermediate portion and including a plurality of fingers and a second opening,
wherein the fingers on the bottom plate are biased in a first direction and the fingers on the top plate are biased in a second direction, the second direction opposite the first direction.

11. The spring plate of claim 10 further comprising a plurality of tabs.

12. The spring plate of claim 11 wherein the first opening is arranged to accept a power conductor.

13. The spring plate of claim 12 wherein the tabs are arranged to fit in openings in a printed circuit board.

14. The spring plate of claim 13 wherein the spring plate mechanically secures and electrically connects the power connector to the printed circuit board when the tabs are soldered to openings in the printed circuit board and the power conductor is inserted in the first opening of the spring plate.

15. The spring plate of claim 14 wherein the second opening is arranged to accept a fastener, the fastener to additionally fasten the printed circuit board and power conductor to the spring plate.

16. A spring plate comprising:
a bottom plate including a first opening and a plurality of fingers; and a first top plate attached to the bottom plate and including a plurality of fingers, the plurality of fingers forming a top of a second opening, wherein the fingers on the bottom plate are biased in a first direction and the fingers on the first top plate are biased in a second direction, the second direction opposite the first direction.

17. The spring plate of claim 16 wherein the first top plate is attached at a left edge and orthogonal to the bottom plate, the spring plate further comprising:

a second top plate attached at a right edge and orthogonal to the bottom plate and including a plurality of fingers, the plurality of fingers forming a top of a third opening.

18. The spring plate of claim 17 wherein the second opening and the third opening are arranged to accept a power conductor.

19. The spring of claim 18 wherein the first opening is arranged to accept a fastener, the fastener to fasten a printed circuit board and the power conductor to the spring plate.

20. A spring plate comprising:

a top plate having a first opening and a plurality of fingers; and a bottom plate having a second opening and a plurality of fingers;

wherein the top plate is attached to the bottom plate at a first end of the top plate and a first end of the bottom plate, such that a third opening is formed between a second end of the top plate and a second end of the bottom plate, the second end of the top plate opposite the first end of the top plate and the second end of the bottom plate opposite the first end of the bottom plate, and wherein the fingers on the bottom plate are biased in a first direction and the fingers on the top plate are biased in a second direction, the second direction opposite the first direction.

21. The spring plate of claim 20 wherein a power conductor may be inserted into the spring plate through the third opening.

22. The spring plate of claim 21 wherein the first opening and the second opening are arranged to accept a fastener, the fastener to fasten a printed circuit board and the power conductor to the spring plate.

23. The spring plate of claim 22 wherein the top plate is split such that a first finger is on a first portion and the first opening is on a second portion, and the first portion and the second portion are at an oblique angle relative to each other.

24. The spring plate of claim 20 wherein the bottom plate is at least approximately parallel to the top plate and the top plate is attached to the bottom plate by a joining piece.

\* \* \* \* \*